(12) United States Patent
Wetzel

(10) Patent No.: US 6,452,392 B1
(45) Date of Patent: Sep. 17, 2002

(54) SPIN RESONANCE SPECTROMETER WITH PROTECTION FROM REFLECTED HARMONICS

(75) Inventor: Norbert Wetzel, Gaggenau (DE)

(73) Assignee: Bruker Analytik GmbH (DE)

( * ) Notice: Subject to any disclaimer, the term of this patent is extended or adjusted under 35 U.S.C. 154(b) by 0 days.

(21) Appl. No.: 09/387,459

(22) Filed: Sep. 1, 1999

(30) Foreign Application Priority Data

Sep. 5, 1998 (DE) .......................... 198 40 622

(51) Int. Cl.[7] .......................... G01V 3/00; G01R 33/36
(52) U.S. Cl. .......................... 324/318; 324/322
(58) Field of Search .......................... 324/318, 322, 324/309, 307, 319, 320, 321, 313, 314, 315

(56) References Cited

U.S. PATENT DOCUMENTS 3,795,855 A * 3/1974 Browning .................. 324/322
4,764,726 A * 8/1988 Misic et al. ................. 324/322
5,229,724 A   7/1993 Zeiger ....................... 324/322
5,280,246 A * 1/1994 Takahashi et al. .......... 324/322
5,814,992 A * 9/1998 Busse-Grawitz et al. ... 324/318

FOREIGN PATENT DOCUMENTS

| DE | 3728863 A1 | 3/1989 | .......... G01R/24/04 |
| DE | 3838252 A1 | 5/1990 | .......... G01N/24/08 |
| DE | 4002160 A1 | 8/1991 | .......... G01R/33/36 |
| GB | 2343000 A  * | 4/2000 | |
| JP | 01011537 A | 1/1989 | |
| JP | 01214357 A | 8/1989 | |

* cited by examiner

Primary Examiner—Edward Lefkowitz
Assistant Examiner—Tiffany A. Fetzner
(74) Attorney, Agent, or Firm—Oppenheimer Wolff & Donnelly LLP; Claude A. S. Hamrick

(57) ABSTRACT

A spin resonance spectrometer comprises a radio frequency transmitter operating at a predetermined basic frequency and a probehead supplied by the radio frequency transmitter. At least one load is interposed between the radio frequency transmitter and the probehead. The load is tuned to a multiple of the basic frequency.

33 Claims, 1 Drawing Sheet

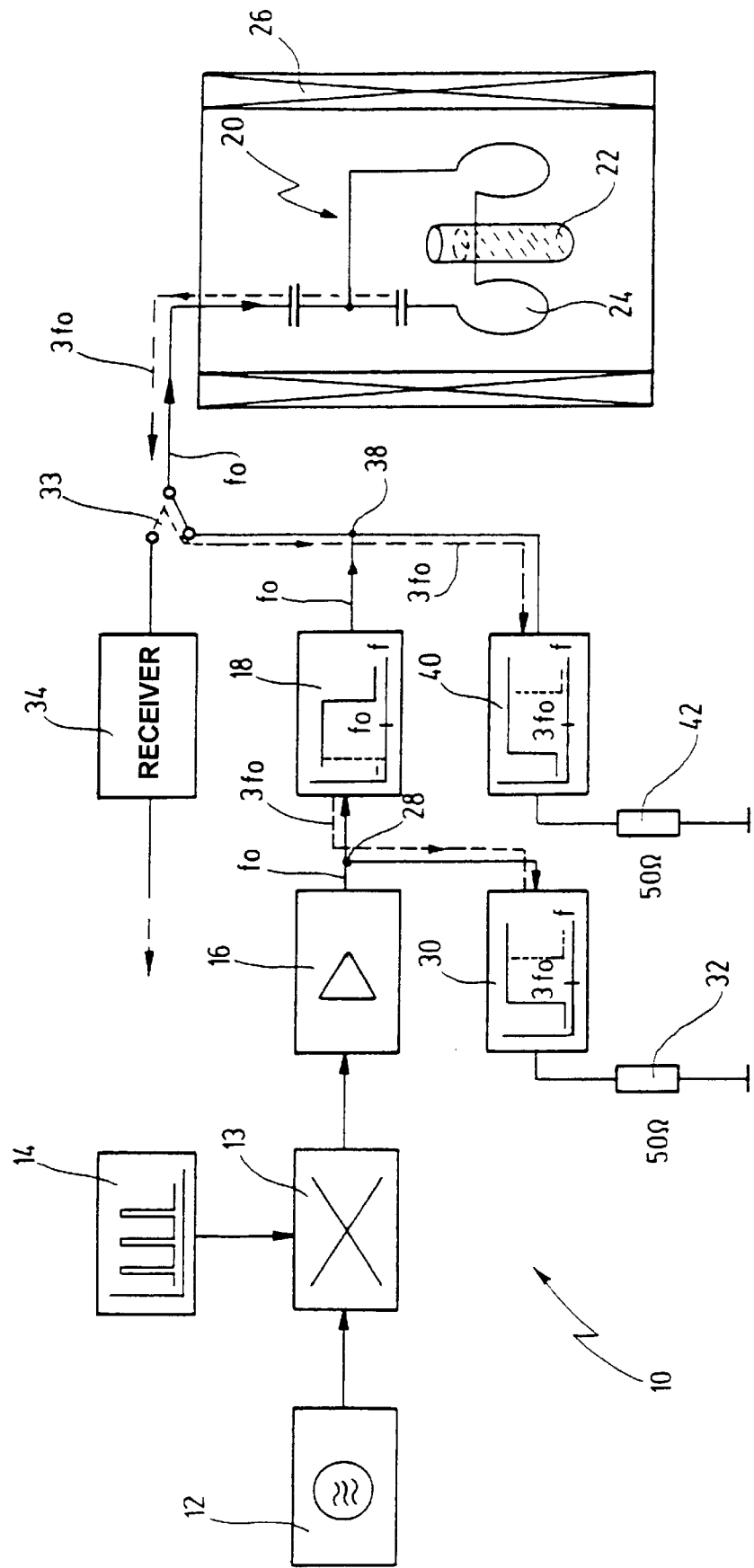

SPIN RESONANCE SPECTROMETER WITH PROTECTION FROM REFLECTED HARMONICS

FIELD OF THE INVENTION

The present invention is related to the field of magnetic resonance.

More specifically, the invention is related to a spin resonance spectrometer comprising a radio frequency transmitter operating at a predetermined basic frequency, and a probehead supplied by the radio frequency transmitter.

BACKGROUND OF THE INVENTION

Spin resonance spectrometers are well-known in the art in various configurations. In the subsequent description the invention shall be illustrated by way of an example, namely a nuclear resonance spectrometer, however, it goes without saying that other spin resonance or magnetic resonance phenomena are also encompassed by the invention, for example electron spin resonance.

Further, the term "spin resonance spectrometer" shall be understood to also comprise apparatuses in which magnetic resonance is utilized in the course of imaging processes, for example in nuclear spin tomography.

In nuclear resonance spectrometers the radio frequency signal is normally fed to the probehead in a gated or pulsed manner. For that purpose a signal of a predetermined basic frequency, normally in the range of several 100 MHz is generated by means of a synthesizer and is then gated by means of a programmable pulse generator according to a predetermined program or pulse sequence, and is subsequently amplified. The amplified signal is routed to the probehead via a low pass filter or via a band pass filter tuned to the basic frequency. The probehead is located within a magnet system and comprises the sample under investigation.

If the probehead is mistuned, harmonics of the basic frequency are generated. These harmonics are reflected from the probehead to the radio frequency transmitter. They enter the radio frequency transmitter at the final power stage and may cause damages or at least a shut down of the transmitter.

It is, therefore, an object underlying the invention to avoid these drawbacks. Accordingly, a spin resonance spectrometer shall be made available that is capable of operating even when the probehead is mistuned relative to the radio frequency transmitter without resulting in an emergency shut down of the radio frequency transmitter or even in damages.

SUMMARY OF THE INVENTION

According to the invention this object is achieved in that at least one load is interposed between the radio frequency transmitter and the probehead, the load being tuned to a multiple of the basic frequency.

The object underlying the invention is thus entirely solved.

The harmonics reflected to the radio frequency transmitter in conventional spectrometers, in particular the most hazardous third harmonic is fed to a load so that it may not result in damages within the radio frequency transmitter.

In a preferred embodiment of the invention this is achieved in that at least one load is connected to a junction between the radio frequency transmitter and the probehead via a first filter being tuned to pass a multiple of the basic frequency. The filter may be a band pass filter tuned to the multiple of the basic frequency or may be a high pass filter, the transition frequency of which being below the multiple of the basic frequency.

These measures have the consequence that a harmonic reflected from the probehead or from a low pass filter between the radio frequency transmitter and the probehead is directly routed after its reflection to the afore-mentioned junction or network node and is, hence, inactivated.

Preferably, the load is a 50Ω load.

According to further embodiments of the invention, the radio frequency transmitter has an output provided with a second filter tuned to pass the basic frequency. The second filter may either be a band pass filter tuned to the basic frequency or may be a low pass filter, the transition frequency of which being above the basic frequency.

These measures, known per se have the advantage that the probehead is protected against harmonics.

According to a first alternative of this preferred embodiment of the invention, a junction is provided directly at the output of the radio frequency transmitter. However, as another alternative or additionally, a junction may be provided at the output of the second filter.

These measures have the advantage that according to the particular situation a first filter may be connected directly to the output of the radio frequency transmitter or to the output of the second filter.

The simultaneous provision of a first and a second filter has the advantage that a diplexer or frequency divider network is configured in which the basic frequency is directly routed from the radio frequency transmitter to the probehead and the measuring signals generated within the probehead may directly return via a transmitter/receiver switch to a receiver channel. The diplexer thereby guarantees that the hazardous harmonics reflected from the first filter are deviated from the transmitter output.

If, according to the above-mentioned second alternative, a first filter is connected to a junction at the output of the second filter, a harmonic generated within the probehead and reflected therefrom is deviated from this junction. This is particularly useful for such probeheads incorporating non-linear components as, for example, superconducting radio frequency coils.

It is, further, particularly preferred when the load is configured broad band, irrespective of its particular location.

This measure has the advantage that reflected spurious signals may be absorbed independent of their specific frequency.

In other preferred embodiments of the invention the load and/or the first filter or the first filter and/or the second filter, respectively, are structurally integrated into the probehead.

In a particularly preferred modification of this embodiment the second filter together with the load are integrated at the input of the probehead, preferably as a resonance circuit having an integrated resistive load. By doing so, it is avoided that the harmonics generated within the probehead are reflected between the probehead and a first filter located outside the probehead.

The spectrometer according to the invention may be equipped with a resistive magnet system or with a superconducting magnet system.

The spectrometer measuring frequency is preferably several 100 MHz.

In embodiments of the invention the probehead comprises a transmitter-and-receiver resonance system. These resonance systems usually comprise radio frequency resonance circuits having radio frequency coils and resistors or resonators. The resonance systems, irrespective of the particular design of the magnet system may as a whole or partially consist of a super-conducting material and may be operated at corresponding super-conducting temperatures.

These measures have the advantage that a high signal-to-noise ratio may be achieved.

The invention is preferably used within single channel spin resonance spectrometers. However, the invention may also be used in multi channel spin resonance spectrometers which, as known per se, comprise a multitude of radio frequency transmitters operating at predetermined basic frequencies and being allocated to a corresponding multitude of transmitter and/or receiver units within the probehead. In that case it is particularly preferred when at least one each load tuned to a multiple of the basic frequency is interposed between at least two of the radio frequency transmitters and the probehead. Moreover, the spectrometer is preferably configured according to one of the afore-described other embodiments of the invention.

Further advantages may be taken from the description and the enclosed drawing.

It goes without saying that the features mentioned before and those that will be explained hereinafter may not only be used in the particularly given combination but also in other combinations or alone without leaving the scope of the present invention.

BRIEF DESCRIPTION OF THE DRAWING

An embodiment of the invention is shown in the drawing and will be explained in the subsequent description.

The only FIGURE shows an extremely simplified block diagram of an embodiment of a spin resonance spectrometer, namely a nuclear resonance spectrometer, according to the invention.

DETAILED DESCRIPTION OF THE PREFERRED EMBODIMENT

In the FIGURE reference 10 as a whole designates a nuclear resonance spectrometer.

Spectrometer 10 comprises an oscillator 12 operating at a predetermined basic frequency $f_0$. Basic frequency $f_0$ nowadays is typically in the order of several 100 MHz.

Oscillator 12 operates on a modulator 13 which, in turn, is controlled by a programmable pulse generator 14. Pulse generator 14 gates the radio frequency input signal according to a predetermined program in order to generate so-called pulse sequences for predetermined nuclear resonance experiments.

The pulsed radio frequency signal is then routed to an amplifier 16. Amplifier 16 is followed by a first filter 18. First filter 18 may either be a low pass filter having a transition frequency above the predetermined basic frequency $f_0$ or may be a band pass filter tuned to basic frequency $f_0$.

A line interconnects first filter 18 with a probehead 20. Probehead 20 comprises a sample holder 22 receiving the sample under investigation. Sample holder 22 cooperates with transmitter-and-receiver resonance systems 24 being connected to the output of first filter 18. Resonance systems 24 may consist of radio frequency resonance circuits with radio frequency coils and capacitors, however, they may also consist of resonators. They may be superconducting as a whole or in part.

Probehead 20 is surrounded by a magnet system 26 which is indicated in the FIGURE as a solenoid coil.

A junction 28 or network node is provided at the input of first filter 18. Another line interconnects junction 28 with a second filter 30. Second filter 30 is tuned to pass a multiple of the basic frequency, preferably the third harmonic of the basic frequency, i.e. $3f_0$. Second filter 30 is either a high pass filter having a transition frequency above the multiple, in particular $3f_0$ or may be a band pass filter tuned to that multiple.

The output of second filter 30 is connected to a load 32 being generally a broad band load, and preferably a 50Ω load.

Finally, the FIGURE shows that probehead 20 in a receiving mode operates via a transmitter-receiver-switch 33 on a receiver amplifier 34 receiving a free induction decay signal from the nuclear resonance samples during the intervals between the pulses generated by pulse generator 14 and directs same to an evaluation electronic circuit (not shown).

As indicated in the FIGURE, a signal of the predetermined basic frequency $f_0$ is present at the input of first filter 18. In particular, if the radio frequency transmitter unit consisting of the elements 12 through 16 is not optimally tuned to probehead 20 via first filter 18, a harmonic, in particular the third harmonic $3f_0$ of the basic frequency $f_0$ may be generated within amplifier 16. This harmonic is reflected by first filter 18, as indicated in the FIGURE by a dashed arrow with inverted direction. The reflected third harmonic would be reflected from junction 28 into amplifier 16 and could cause damages therein if second filter 30 with the load 32 were not connected to junction 28. As second filter 30 is tuned to the third harmonic, the third harmonic is directly routed to load 32 and absorbed therein.

As an alternative or in addition to the circuitry starting from junction 28 at the output of amplifier 16, another junction 38 at the output of first filter 18 may be connected to a line directed to a third filter 40. Third filter 40 may also be a high pass filter having a transition frequency above a multiple, in particular above $3f_0$ or may be a band pass filter tuned to that multiple.

The output of third filter 40 is also connected to a load 42 which is normally a broad band load and preferably a 50Ω load.

At the output of first filter 18, i.e. at the further junction 38 the FIGURE shows that there is a signal of the predetermined basic frequency $f_0$. If harmonics are generated, in particular due to non-linear superconducting components within probehead 20, these may be reflected to and fro between the transmitter-and-receiver high frequency system 24 and first filter 18. This oscillating effect is avoided by directing the wave, reflected from probehead 20, via third filter 24 to load 42 to be absorbed therein, as indicated in the Figure with a dashed arrow in inverted direction. Third filter 40 together with corresponding load 42 may be structurally integrated into probehead 20, for example as a resonance circuit (a dipole with an integrated resistor).

The invention also encompasses a multi-channel spin resonance spectrometer with a multitude of transmitter and/or receiver channels operating at the radio frequency, some or all of which being configured as described before. Generally probehead 20 has some of these radio frequency transmitter and/or receiver systems 24 or is tuned to various frequencies.

What is claimed is:

1. A spin resonance spectrometer for investigating samples comprising a radio frequency transmitter operating at a predetermined basic frequency and a probehead supplied by said radio frequency transmitter, wherein at least one load is interposed between said radio frequency transmitter and said probehead, said load being tuned to a multiple of the basic frequency and being arranged for absorbing reflected harmonic signals.

2. The spectrometer of claim 1, wherein said at least one load is connected to a junction between said radio frequency transmitter and said probehead via a first filter, said first filter being tuned to pass a multiple of said basic frequency.

3. The spectrometer of claim 2, wherein a junction is provided directly at an output of said radio frequency transmitter.

4. The spectrometer of claim 2, wherein said first filter is a band pass filter tuned to said multiple of said basic frequency.

5. The spectrometer of claim 2, wherein said first filter is a high pass filter, a transition frequency of which being below said multiple of said basic frequency.

6. The spectrometer of claim 1, wherein said load is a 50 load.

7. The spectrometer of claim 1, wherein said load is a broad band load.

8. The spectrometer of claim 1, wherein said radio frequency transmitter has an output provided with a second filter tuned to pass said basic frequency.

9. The spectrometer of claim 8, wherein a junction is provided at an output of said second filter.

10. The spectrometer of claim 8, wherein said second filter is a band pass filter tuned to said basic frequency.

11. The spectrometer of claim 8, wherein said second filter is a low pass filter, a transition frequency of which being above said basic frequency.

12. The spectrometer of claim 1, wherein said load is structurally integrated into said probehead.

13. The spectrometer of claim 2, wherein said at least one filter is structurally integrated into said probehead.

14. The spectrometer of claim 1, wherein said second filter is structurally integrated into said probehead.

15. The spectrometer of claim 1, wherein said probehead comprises at least one transmitter and receiver resonance circuit consisting at least partially of a superconducting material and being adapted to be operated at a corresponding superconducting temperature.

16. The spectrometer of claim 1, wherein said basic frequency is above 100 MHz.

17. A multi channel spin resonance spectrometer comprising a given plurality of radio frequency transmitters operating at predetermined basic frequencies, said radio frequency transmitters being allocated to a corresponding number of transmitter and/or receiver units within a probehead, wherein at least one load tuned to a multiple of said basic frequency is interposed between each of at least two of said radio frequency transmitters and said probehead.

18. The spectrometer of claim 17, wherein said at least one load is connected to a junction between said radio frequency transmitter and said probehead via a first filter, said first filter being tuned to pass a multiple of said basic frequency.

19. The spectrometer of claim 18, wherein a junction is provided directly at an output of said radio frequency transmitter.

20. The spectrometer of claim 18, wherein said first filter is a band pass filter tuned to said multiple of said basic frequency.

21. The spectrometer of claim 18, wherein said first filter is a high pass filter, a transition frequency of which being below said multiple of said basic frequency.

22. The spectrometer of claim 17, wherein said load is a 50 load.

23. The spectrometer of claim 17, wherein said load is a broad band load.

24. The spectrometer of claim 17, wherein said radio frequency transmitter has an output provided with a second filter tuned to pass said basic frequency.

25. The spectrometer of claim 24, wherein a junction is provided at an output of said second filter.

26. The spectrometer of claim 24, wherein said second filter is a band pass filter tuned to said basic frequency.

27. The spectrometer of claim 24, wherein said second filter is a low pass filter, a transition frequency of which being above said basic frequency.

28. The spectrometer of claim 17, wherein said load is structurally integrated into said probehead.

29. The spectrometer of claim 18, wherein said at least one filter is structurally integrated into said probehead.

30. The spectrometer of claim 17, wherein said second filter is structurally integrated into said probehead.

31. The spectrometer of claim 17, wherein said probehead comprises at least one transmitter and receiver resonance circuit consisting at least partially of a superconducting material and being adapted to be operated at a corresponding superconducting temperature.

32. The spectrometer of claim 17, wherein said basic frequency is above 100 MHz.

33. A spin resonance spectrometer for investigating samples comprising a radio frequency transmitter operating at a predetermined basic frequency;

a programmable pulse generator adapted to gate said radio frequency transmitter according to a predetermined program for generating pulse sequences at an output of said radio frequency transmitter;

a probehead supplied by said radio frequency transmitter, a transmitter-receiver switch arranged at an input of said probehead, said transmitter-receiver switch being adapted to direct in a receiving mode free induction signals from said probehead to a receiver amplifier of an evaluation electronic circuit during intervals between pulses of said pulse sequences at least one load interposed between said radio frequency transmitter and said probehead, said load being tuned to a multiple of said basic frequency and being arranged for absorbing reflected harmonic signals.

* * * * *